(12) United States Patent
Tagami et al.

(10) Patent No.: US 9,799,803 B2
(45) Date of Patent: Oct. 24, 2017

(54) LED MODULE WITH MULTI-LAYER RESIST

(71) Applicant: Panasonic Intellectual Property Management Co., Ltd., Osaka (JP)

(72) Inventors: Naoki Tagami, Miyagi (JP); Masumi Abe, Osaka (JP); Hisaki Fujitani, Kyoto (JP); Kosuke Takehara, Osaka (JP); Toshiaki Kurachi, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/223,713

(22) Filed: Jul. 29, 2016

(65) Prior Publication Data
US 2017/0040497 A1 Feb. 9, 2017

(30) Foreign Application Priority Data

Aug. 3, 2015 (JP) ................................. 2015-153719

(51) Int. Cl.
*H01L 33/48* (2010.01)

(52) U.S. Cl.
CPC .. *H01L 33/486* (2013.01); *H01L 2224/32225* (2013.01); *H01L 2224/48227* (2013.01); *H01L 2224/48228* (2013.01); *H01L 2224/73265* (2013.01); *H01L 2924/181* (2013.01)

(58) Field of Classification Search
None
See application file for complete search history.

(56) References Cited

U.S. PATENT DOCUMENTS

| 2014/0104850 | A1 | 4/2014 | Yamamoto et al. | |
| 2015/0069332 | A1* | 3/2015 | Kitamura | C07D 307/91 257/40 |
| 2015/0249194 | A1 | 9/2015 | Yamamoto et al. | |
| 2016/0072026 | A1* | 3/2016 | Kanaumi | H01L 33/507 257/98 |

FOREIGN PATENT DOCUMENTS

| JP | 2011-066267 | 3/2011 |
| JP | 2011-176017 | 9/2011 |
| JP | 2013-004815 | 1/2013 |
| JP | 2014-146685 | 8/2014 |
| WO | WO 2014/030313 A1 | 2/2014 |

* cited by examiner

*Primary Examiner* — Bilkis Jahan
(74) *Attorney, Agent, or Firm* — Renner Otto Boisselle & Sklar, LLP

(57) ABSTRACT

A light emitting diode (LED) module including: a substrate; a resist including a plurality of layers, above the substrate; and an LED element mounted above the resist via an adhesive. The adhesive includes an addition-reaction type silicone resin. In the resist, a higher positioned layer of the plurality of layers is lower in at least one of sulfur content, phosphorus content, and nitrogen content than a lower positioned layer of the plurality of layers.

11 Claims, 3 Drawing Sheets

LED MODULE WITH MULTI-LAYER RESIST

CROSS REFERENCE TO RELATED APPLICATION

This applications, claims the benefit of priority of Japanese Patent Application Number 2015-353719 filed on Aug. 8, 2015, the entire content of which is hereby incorporated by reference.

BACKGROUND

1. Technical Field

The present disclosure relates to a light emitting diode (LED) module including an LED.

2. Description of the Related Art

Semiconductor light-emitting elements such as LEDs are highly efficient and long-life elements, and thus widely used as light sources for various devices. An LED is used, for example, as an illumination light source in a lamp, a lighting device, etc., or as a backlight light source in a liquid-crystal display apparatus.

The LEDs are generally unitized as an LED module and included in various devices. The LED module includes, for example, a substrate and at least one LED element mounted on the substrate.

More specifically, an LED module is known which has a chip on board (COB) structure that includes one or more LED chips (LED elements) mounted directly an a substrate (Patent Literature 1: Japanese Unexamined Patent Application Publication No. 2011-176017). Another known LED module is an LED module in which one or more surface mount device (SMD) LED elements, in each of which an LED chip is housed in a container and packaged, are mounted on a substrate.

SUMMARY

There are instances where a resist is disposed on a surface of a substrate on which LED elements (LED chips) are to be mounted. LED chips are mourned on a resist, for example, through, die bonding using a die attach agent (adhesive). In other words, LED elements are bonded on a resist via a die attach agent.

A resist generally includes a resin material. For example, a development-type resist including an epoxy resin which contains a photocurable agent is used for a resin substrate included in the LED module having the COB structure. As a die attach agent used for die bonding of LED elements, an addition-reaction type agent including a silicone resin is employed, for example.

In this case, however, it was found that inhibition of curing of the die attach agent occurs due to the effect of each component of sulfur (S), phosphorus (P), and nitrogen (N) included in the photocurable agent of the resist, leading to a decrease in adhesion strength between the LED elements and the resist. The decrease in the adhesion strength between the LED elements and the resist poses a problem of a decrease in reliability of the LED module.

The present disclosure has been conceived to solve the problem described above, and an object of the present disclosure is to provide a highly reliable LED module.

In order to achieve the above-described object, an LED module according to an aspect of the present disclosure includes: a substrate; a resist including a plurality of layers, above the substrate; and an LED element mounted above the resist via an adhesive, wherein the adhesive includes an addition-reaction type silicone resin, and in the resist, a higher positioned layer of the plurality of layers is lower in at least one of sulfur content, phosphorus content, and nitrogen content than a lower positioned layer of the plurality of layers.

The adhesion strength between LED elements and the resist is ensured, and thus it is possible to implement a highly reliable LED module.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENT

The following describes an embodiment of the present disclosure. It should be noted that the subsequently-described embodiment shows a specific example of the present disclosure. Thus, the numerical values, structural components, the disposition and connection of the structural components, steps, the processing order of the steps, and others described in the following embodiment are mere examples, and do not intend to limit the present disclosure. Furthermore, among the structural, components in the following embodiment, components not recited in the independent claim which indicates the broadest concept of the present disclosure are described as arbitrary structural components.

In addition, each diagram is a schematic diagram and not necessarily strictly illustrated. In each of the diagrams, substantially the same structural components are assigned with the same reference signs, and redundant descriptions will fee omitted or simplified.

Embodiment

Figure 1:
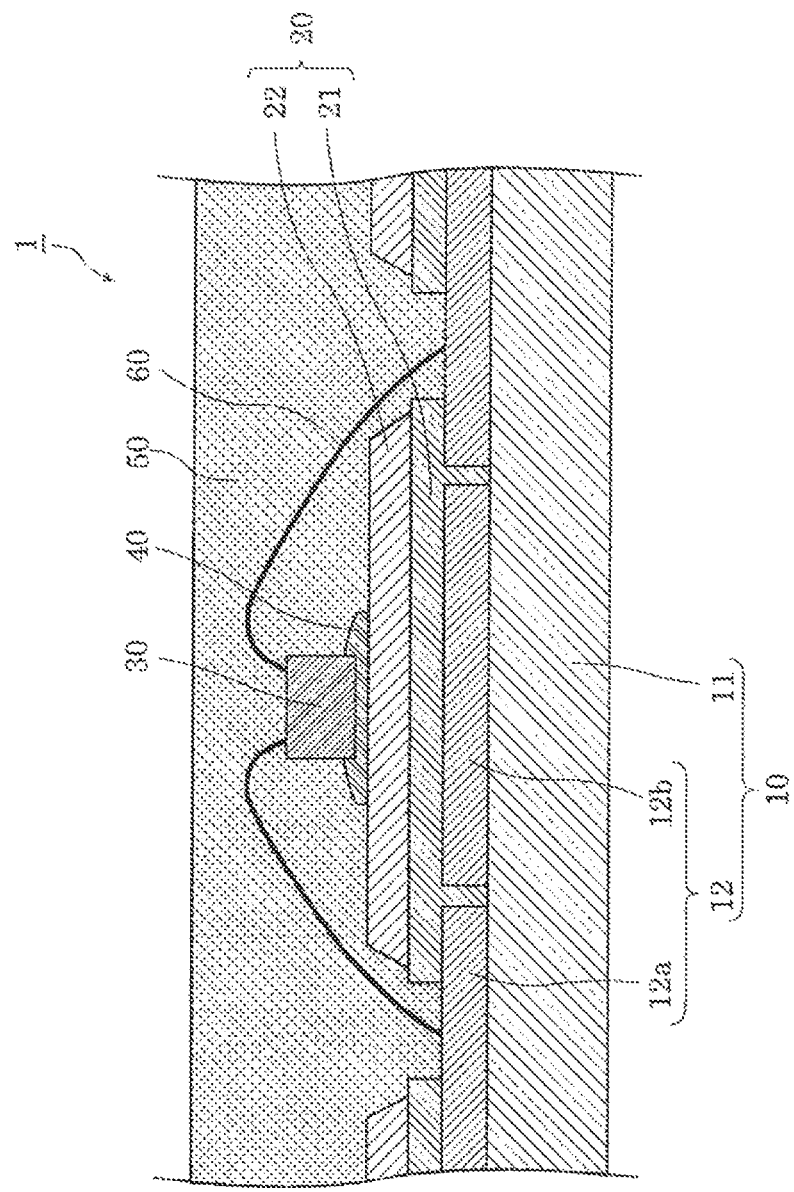
FIG. 1 is a partial cross-sectional view of an LED module according to an embodiment.

The following describes a configuration of LED module 1 according to an embodiment, with reference to FIG. 1.

FIG. 1 is a partial cross-sectional view of LED module 1 according to the embodiment.

As illustrated in FIG. 1, LED module 1 includes substrate 10, resist 20, LED element 30, and adhesive 40. In the embodiment, LED module 1 further includes sealing member 50. LED module 1 emits white light, for example.

Substrate 10 is a mounting substrate for mounting LED element 30. According to the embodiment, substrate 10 is a resin substrate including a resin as a base, and includes resin base 11 (a resin layer) and metal layer 12 formed on a surface of resin base 11.

As resin base 11, the following bases may be used, for example: a glass epoxy base (FR-4) including a glass epoxy formed of a glass fiber and an epoxy resin; a glass composite base (CEM-3); a paper phenol base (FR-1, FR-2) including a craft paper or the like and a phenol resin; a paper epoxy base (FR-3) including a paper and an epoxy resin; a flexible base including polyimide, etc. and having flexibility, etc. Resin base 11 has a thickness of for example, 1 mm.

Metal layer 12 (metal film) is, for example, a metal line formed on an upper surface of resin base 11 with a pattern having a predetermined shape. Metal layer 12 is, for example, a copper line (copper layer) including copper (Cu). It should be noted that a material of metal layer 12 is not limited to copper, and metal materials other than copper, or other conductive materials may be employed.

In the embodiment, metal layer 12 includes first metal line 12a which is electrically connected to LED element 30 and passes a current therethrough, and second metal line 12b which, is electrically disconnected to LED element 30 and does not pass a current therethrough. In other words, second metal line 12b is in a state of electrically floating (i.e., floating state), and thus does not pass a current for light emission of LED element 30.

According to the embodiment, second metal line 12b is disposed under LED element 30. Accordingly, second metal line 12b serves as a heat dissipator for dissipating heat generated by LED element 30. In addition, first metal line 12a also servos as a heat dissipator. It should be noted that second metal line 12b need not be disposed directly beneath LED element 30.

Metal layer 12 may be formed into a predetermined shape through printing or the like, or by etching a portion of a metal film (e.g., copper foil) formed on the entire surface of resin base 11. Metal layer 12 has a thickness of 35 μm, for example.

It should be noted that the shape of substrate 10 having the above-described configuration is not specifically limited, and for example, an elongated rectangle substrate or a regular polygon substrate such as a square substrate may be used as substrate 10. Furthermore, substrate 10 is not limited to a resin substrate, and may be a metal base substrate including metal as a base, a ceramic substrate including a ceramic material such as alumina, a glass substrate including a glass material, etc.

Resist 20 (resist layer) is disposed above substrate 10. According to the embodiment, resist 20 is disposed on a surface of substrate 10. More specifically, resist 20 is disposed on a surface of metal layer 12 to cover metal layer 12 of substrate 10.

Resist 20 has a stacked structure including a plurality of layers. According to the embodiment, resist 20 is composed of two layers which are first layer 21 (i.e. first resist layer) that is the undermost layer and second layer 22 (i.e., second resist layer) that is the uppermost layer.

Resist 20 (i.e., first layer 21 and second layer 22) is an insulating film including a resin material having insulation properties. It is possible, by covering metal layer 12 with resist 20, to improve the insulation properties (withstand voltage) of substrate 10, and also possible to suppress oxidation of metal layer 12.

According to the embodiment resist 20 (i.e., first layer 21 and second layer 22) includes a material having reflectivity for reflecting, off substrate 10, light emitted from LED element 30 when the light returns to substrate 10. For that reason, resist 20 (i.e., first layer 21 and second layer 22) is a white resist including a white resin material in which a white pigment such as titania and silica is included for achieving high reflectance. In this manner, by employing a white resist as resist 20, it is possible to improve light extraction, efficiency of LED module 1.

More specifically, first layer 21, which is the undermost layer of resist 20 according to the embodiment, includes a development-type resist material. For that reason, first layer 21 includes a photocurable agent. It is possible to form first layer 21 with excellent pattern accuracy, by employing the development-type resist material.

In this case, the resist material of first layer 21 is an epoxy resin, for example. According to the embodiment, the resist material of first layer 21 is a novolac-type epoxy resin. First layer 21 has a thickness of 20 μm; for example.

Meanwhile, second layer 22, which is the uppermost layer of resist 20 according to the embodiment, includes a thermosetting resist material. It is possible to pattern second layer 22 having excellent thermal resistance and light resistance at low cost, by employing the thermosetting resist material.

In this case, the resist material of second layer 22 is also an epoxy resin. According to the embodiment, the resist material of second layer 22 is a novolac-type epoxy resin as with first layer 21. Second layer 22 has a thickness of 20 μm; for example. In other words, according to the embodiment, first layer 21 has a thickness equivalent to a thickness of second layer 22, However, second layer 22 may have a thickness greater than a thickness of first layer 21.

In resist 20 configured in this manner, a higher positioned layer of the plurality of layers in resist 20 is lower in at least one of sulfur (S) content, phosphorus (P) content, and nitrogen (N) content than a lower positioned layer of the plurality of layers included in resist 20.

According to the embodiment, second layer 22 that is the uppermost layer is lower in at least one of sulfur content, phosphorus content, and nitrogen content than first layer 21 that is the undermost layer. In this case, second layer 22 may be lower in each of sulfur content, phosphorus content, and nitrogen content than first layer 21.

Here, the development-type resist material includes a photocurable agent. The photocurable agent includes sulfur, phosphorus, and nitrogen. In the photocurable agent, sulfur and phosphorus each serve as a photopolymerization initiator, and nitrogen is present as an amine compound and serves as a curing agent. On the other hand, the thermosetting resist material includes no photocurable agent. For that reason, the thermosetting resist material does not include sulfur and phosphorus, but includes nitrogen, as a curing agent.

According to the embodiment, second layer 22 of resist 20 is formed using the thermosetting resist material, and thus second layer 22 does not include a photocurable agent. Accordingly, second layer 22 includes nitrogen, but does not include sulfur and phosphorus. In contrast, first layer 21 is formed using the development-type resist material, and thus first layer 21 includes a photocurable agent. Accordingly, first layer 21 includes each of sulfur, phosphorus, and nitrogen.

LED element 30 is mounted above resist 20 via adhesive 40. More specifically, LED element 30 is mounted above the uppermost layer of resist 20; that is, second layer 22 according to the embodiment.

According to the embodiment, LED element 30 is an LED chip which emits monochromatic visible light (bare chip). For example, LED element 30 is a blue LED chip which emits blue light when current is supplied, and a semiconductor light-emitting element of gallium nitride (GaN) series having a peak wavelength ranging from 440 nm to 470 nm. In addition, LED element 30 has a single-sided electrode structure in which a p-type electrode and an n-type electrode are both disposed on an upper surface of a nitride semiconductor layer disposed on a sapphire substrate.

In addition, adhesive 40 is a die attach agent (die bond agent), for example. Accordingly, LED element 30 is die-bonded on resist 20 with adhesive 40. Adhesive 40 includes an addition-reaction type silicone resin, for example. According to the embodiment, adhesive 40 includes a platinum catalyst.

In addition, LED element 30 (LED chip) is connected to metal layer 12 of substrate 10 through wire bonding. More specifically, LED element 80 and first metal line 12a of metal layer 12 are connected to each other with wire 60. Wire 60 is a gold wire, for example.

It should be noted that only a single LED element 30 may be mounted on substrate 10, or a plurality of LED elements 30 may be mounted on substrate 10. Furthermore, when a plurality of LED elements 30 are mounted, LED elements 30 may be two-dimensionally arranged, such as in a matrix, or may be aligned in one or more straight lines (one dimensionality).

Sealing member 50 seals LED element 30 that is an LED chip. Sealing member 50 includes a wavelength converting material which is excited by light emitted from LED element 30 and emits light having a wavelength different from a wavelength of the light emitted from LED element 30, and a light-transmissive material including the wavelength converting material.

As the light-transmissive material included in sealing member 50, for example, a light-transmissive insulating resin material such as a silicone resin, an epoxy resin, and a fluorinated resin can be employed. The light-transmissive material is not limited to an organic material such as a resin material, and an inorganic material such, as a low-melting-point glass and a sol-gel glass may be employed.

The wavelength converting material included in sealing member 50 is a phosphor, for example. The phosphor is included in the light-transmissive material and excited to emit fluorescent light with light emitted by LED element 30 being excitation light, thereby emitting light of a desired color (wavelength).

LED element 30 according to the embodiment is a blue LED chip, and thus an yttrium-aluminum-garnet (YAG) yellow phosphor can be employed as the phosphor for obtaining white light. With this, the wavelength of a portion of the blue light emitted by the blue LED chip is absorbed by the yellow phosphor and converted to yellow light. In other words, the yellow phosphor is excited by blue light emitted from the blue LED chip and emits yellow light. White light is generated as synthetic light which is a mixture of yellow light emitted from the yellow phosphor and blue light that has not been absorbed by the yellow phosphor, and the white light is emitted from sealing member 50.

It should be noted that, sealing member 50 may further include a red phosphor for increasing the color rendering property. In addition, in sealing member 50, light diffusion members such as silica for increasing the light diffusion properties or fillers for suppressing sedimentation of phosphors may be dispersed.

Sealing member 50 according to the embodiment is a phosphor-containing resin including yellow phosphors dispersed to a silicone resin. Sealing member 50 is, for example, applied to substrate 10 using a dispenser to cover LED element 30 mounted above substrate 10, and cured, thereby being formed, into a predetermined shape. The cross-section surface of sealing member 50 formed in tins manner has a substantially semi-circular shape.

In addition, when a plurality of LED elements 30 are mounted above substrate 10, sealing member 50 may collectively seal LED elements 30. In this case, sealing member 50 may be disposed in a linear shape along the array of LED elements 30, or may be disposed in a circular shape. In addition, sealing member 50 may separately seal LED elements 30 one by one through potting.

LED module 1 configured in this manner is a light-emitting module having the chip on board (COB) structure in which LED element 30, which is an LED chip, is directly mounted above substrate 10.

In addition, although illustration is omitted here, substrate 10 may include an electrode terminal for receiving, from outside LED module 1, DC power for causing LED element 30 to emit light. When the electrode terminal is a metal electrode, the metal electrode is at least partly not covered with, resist 20 and exposed from resist 20.

As described above, in LED module 1 according to the embodiment, LED element 30 is mounted above resist 20 using adhesive 40 including an addition-reaction type silicone resin. According to LED module 1, in resist 20, a higher positioned layer of the plurality of layers is lower in at least one of sulfur content, phosphorus content, and nitrogen content than a lower positioned layer of the plurality of layers.

Sulfur, phosphorus, and nitrogen each inhibit curing of adhesive 40 including the addition-reaction type silicone resin. Accordingly, it is possible to suppress inhibition of curing of adhesive 40, by setting each of the sulfur content, the phosphorus content, and the nitrogen content to be lower in a higher positioned layer of the plurality of layers of resist 20, to which adhesive 40 is adhered, than a lower positioned layer of the plurality of layers. In this manner, the adhesion strength, between LED element 30 and resist 20 is ensured, and thus a highly reliable LED module can be implemented.

In addition, according to the embodiment, adhesive 40 which causes LED element 30 to adhere to resist 20 includes a platinum-based catalyst.

The platinum-based catalyst promotes curing of addition-reaction type adhesive 40. For example, in adhesive 40 including an addition-reaction type silicone resin, silicone polymer having a vinyl group (base compound) and silicone polymer having an H group (curing agent) are cured by hydroxylation reaction with platinum-based catalyst.

According to experimental, results of the inventors, inhibition of curing due to sulfur, phosphorus, and nitrogen is more likely to occur when the platinum-based catalyst is included in adhesive 40. This is thought to be due to deactivation of the platinum-based catalyst caused by sulfur, phosphorus, and nitrogen, which decreases the effect of catalyst, and thus makes curing reaction difficult to advance.

Accordingly, when adhesive 40 includes the platinum-based catalyst, each of the sulfur content, the phosphorus content, and the nitrogen content is set lower in a higher positioned layer of the plurality of layers of resist 20 than a lower positioned layer of the plurality of layers, thereby improving the effect of suppressing inhibition of curing of adhesive 40.

In addition, according to the embodiment, the uppermost layer (second layer 22) of resist 20 may include a thermosetting resist material.

The thermosetting resist material does not include sulfur or phosphorus. Accordingly, by employing the thermosetting resist material as a material of the uppermost layer of resist 20, it is possible to easily set the sulfur content and the phosphorus content in the uppermost layer to be lower than the sulfur content and the phosphorus content in the underlying layer. Specifically, it is possible to set the sulfur content and the phosphorus content in second layer 22 to be lower than the sulfur content and the phosphorus content in first layer 21. This allows easily suppressing inhibition of curing of adhesive 40, and thus it is possible to easily implement a highly reliable LED module.

In addition, according to the embodiment, an epoxy resin may be employed as the resist material of the uppermost layer (second layer 22) of resist 20.

This allows easily increasing the hardness of the uppermost layer of resist 20, and thus it is possible to harden the uppermost layer of resist 20 which serves as a base when LED element 30 is mounted shove resist 20. Accordingly, it is possible to suppress denting of resist 20 when LED element 30 is mounted above resist 20, thereby decreasing the possibility of LED element 30 being mounted at a tilt. As a result, it is possible to implement a more highly reliable LED module.

In addition, according to the embodiment, the undermost layer of resist 20 may include a development-type resist material.

The undermost layer of resist 20 needs to have higher pattern accuracy than an upper layer. Accordingly, the development-type resist material is adopted as a material of the undermost layer of resist 20, thereby easily improving the pattern accuracy of the undermost layer. In this manner, it is possible to implement a more highly reliable LED module.

According to the embodiment, resist 20 is composed of two layers which are first layer 21 that is the undermost layer and second layer 22 that is the uppermost layer.

This configuration allows first layer 21 and second layer 22 to have functions different from each other. For example, according to the embodiment, it is possible to configure first layer 21 (the undermost layer) with the development-type resist material and second layer 22 (the uppermost layer) with the thermosetting resist material. With this configuration, it is possible to ensure pattern accuracy in first layer 21 and also ensure thermal resistance and light resistance in second layer 22. Accordingly, it is possible to form resist 20 with excellent pattern accuracy and implement the LED module with excellent thermal resistance and light resistance. As a result, it is possible to implement a more highly reliable LED module.

In this case, second layer 22 that is the uppermost layer may have a thickness greater than a thickness of first layer 21 that is the undermost layer.

With this configuration, if is possible to improve the thermal resistance and also easily maintain the light-emitting properties of LED module 1. Furthermore, it is possible to protect first layer 21 by second layer 22. This, allows implementing the LED module which is more highly reliable.

Furthermore, according to the embodiment, substrate 10 includes resin base 11.

With this configuration, it is possible to implement the LED module including substrate 10 that is a resin substrate.

In addition, according to the embodiment, substrate 10 includes metal layer 12 disposed on a surface of resin base 11, and resist 20 is disposed on a surface of metal layer 12.

With this configuration, it is possible to improve the insulation properties (withstand voltage) of substrate 10, and also possible to suppress oxidation of metal layer 12. Accordingly, it is possible to implement a more highly reliable LED module.

In addition, according to the embodiment, LED element 30 is an LED chip which is connected to metal layer 12 through wire bonding.

This allows implementing the LED module having the COB structure. Furthermore, it is possible to supply LED element 30 with power for causing LED element 30 to emit light, via metal layer 12.

In addition, according to the embodiment, LED module 1 further includes sealing member 50 which seals LED element 30.

With this configuration, it is possible to protect LED element 30 with sealing member 50. Moreover, by including a wavelength converting material such as a phosphor into sealing member 50, it is possible to implement an LED module which emits light having a color different from a color of light emitted by LED element 30.

Modification 1

Figure 2:
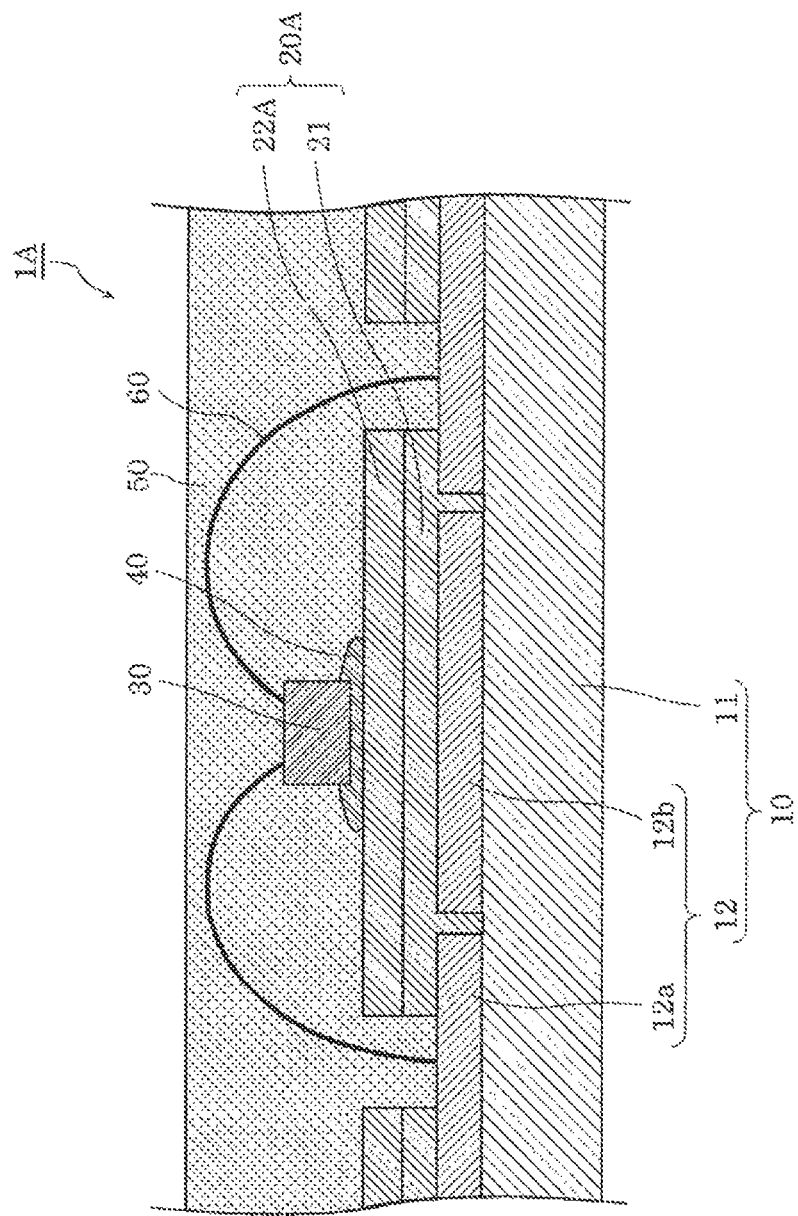
FIG. 2 is a partial cross-sectional view of an LED module according to Modification 1.

FIG. 2 is a partial cross-sectional view of LED module 1A according to Modification 1.

According to the above-described embodiment, resist 20 of LED module 1 includes first layer 21 and second layer 22 which are formed using different resist materials. However, according to the present modification, resist 20A of LED module 1A includes first layer 21 and second layer 22 which are formed using the same resist material.

More specifically, first layer 21 and second layer 22A both include the development-type resist material, according to the present modification. For example, the novolac-type epoxy resin may be employed as the resist material of first layer 21 and second layer 22A.

In addition, as with the above-described embodiment, second layer 22A that is the uppermost layer Is lower in at least one of sulfur content, phosphorus content, and nitrogen content than first layer 21 that is the undermost layer, according to the present modification.

With this configuration, it is possible to suppress inhibition of coring of adhesive 40 caused by sulfur, phosphorus, and nitrogen, in LED module 1A according to the present modification. Accordingly, the adhesion strength between LED element 30 and resist 20A is ensured, and thus it is possible to implement a highly reliable LED module.

In addition, first layer 21 and second layer 22A of resist 20A both include the development-type resist material, according to the present modification.

With this configuration, it Is possible to further improve the pattern accuracy of resist 20 compared to the above-described embodiment.

Modification 2

Figure 3:
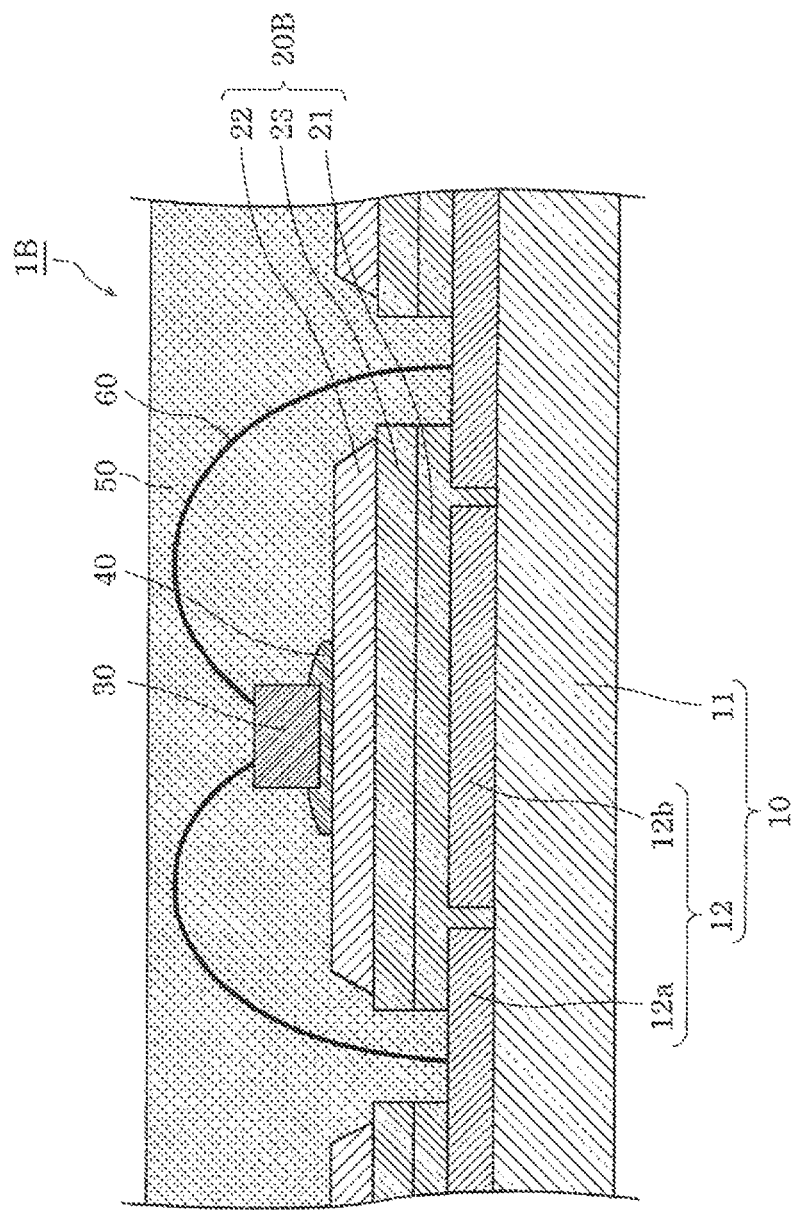
FIG. 3 is a partial cross-sectional view of an LED module according to Modification 2.

FIG. 3 is a partial cross-sectional view of LED module 1B according to Modification 2.

Resist 20 of LED module 1 according to the above-described embodiment has the two-layer structure including first layer 21 and second layer 22. In contrast, according to the present modification, resist 20B of LED module 1B has a three-layer structure including first layer 21 that is the undermost layer, third layer 23 that is an interlayer, and second layer 22 that is the uppermost layer. In other words, resist 20B according to the present modification includes third layer 23 as the interlayer between first layer 21 and second layer 22 included in resist 20 according to the above-described embodiment.

The resist materials of first layer 21 and second layer 22 according to the present modification are the same as the resist materials described in the above-described embodiment. For example, first layer 21 includes a development-type resist material, and second layer 22 includes a thermosetting resist material. In addition, the resist materials included in first layer 21 and second layer 22 are both the novolac-type epoxy resin.

Third layer 23 includes the development-type resist material, according to the present modification. More specifically, the resist material included in third layer 23 is the novolac-type epoxy resin. It should be noted that third layer 23 may include the thermosetting resist material.

As with the above-described embodiment, second layer 22 that is the uppermost layer is lower in at least one of sulfur content, phosphorus content, and nitrogen content than first layer 21 that is the undermost layer, according to the present modification.

With this configuration, it is possible to suppress inhibition of curing of adhesive 40 caused by sulfur, phosphorus, and nitrogen, in LED module 1B according to the present modification. Accordingly, the adhesion strength between LED element 30 and resist 20 is ensured, and thus it is possible to implement a highly reliable LED module.

It should be noted that, according to the present modification, second layer 22 that is the uppermost layer is lower in each of the sulfur content, the phosphorus content, and the nitrogen content than third layer 23 that is the interlayer. In addition, third layer 23 that is the inter layer is lower in each of the sulfur content, the phosphorus content, and the nitrogen content than first layer 21 that is the undermost layer.

Others

The LED module according to the present disclosure has been described based on the embodiment and modifications as above; however, the present disclosure is not limited to the above-described embodiment and modifications.

For example, although the novolac-type epoxy resin is employed as the material of resist 20 (first layer 21 and second layer 22) in the above-described embodiment and modifications, the material of resist 20 is not limited to the novolac-type epoxy resin. As the material of resist 20, for example, a bisphenol A type epoxy resin may be employed.

In addition, although resist 20 and resist 20A each have the two-layer structure and resist 20B has the three-layer structure in the above-described embodiment and modifications, the structure of the resist is not limited to these examples. For example, the resist may include four or more layers.

Furthermore, although the LED module having the COB structure including LED element 30 as an LED chip directly mounted on substrate 10 is exemplified in the above-described embodiment and modifications, the LED module is not limited to this example. For example, an SMD LED element in which an LED chip is individually packaged may be employed as LED element 30, and the LED module may include one or more LED elements 30 mounted on substrate 10. In this case, LED element 30 which is the SMD LED element includes, for example, a container including a white resin and having a cavity, an LED chip (e.g., a blue LED chip) mounted in the cavity of the container, and a sealing member (e.g., a yellow phosphor-containing resin) filling the cavity of the container.

In addition, although LED module 1 (LED element 30) according to the above-described embodiment and modifications emits white light using the blue LED chip and the yellow phosphor, the present disclosure is not limited to this example. For example, white light may be emitted by using a phosphor-containing resin including a red phosphor and a green phosphor, and combining the phosphor-containing resin and the blue LED chip. Furthermore, an LED chip which emits color of light other than blue may be employed. Alternatively, white light may be generated by combining an ultraviolet LED chip which emits ultraviolet light having a shorter wavelength than light emitted by the blue LED chip and phosphors which respectively emit the three primary colors (red, green, and blue) by being excited mainly by ultraviolet light.

In addition, although, a phosphor is employed as the wavelength converting material according to the above-described embodiment and modifications, the wavelength converting material is not limited to the phosphor. As the wavelength converting material, for example, a material including a substance which absorbs light of a certain wavelength such, as a semiconductor, a metal complex, an organic dye, and a pigment, and emits light of a wavelength different from the wavelength of the absorbed light.

In addition, the LED module according to the above-described embodiment and modifications may be employed as an illumination light source for a lighting device (fighting apparatus) such as a downlight, spotlight, and base light. Moreover, the LED module may also be used as a light source for purposes other than illumination purpose, such as a backlight light source for a liquid-crystal display apparatus or the like, a lamp light source for a copy machine or the like, a light source for a guide light or a signboard device.

It should be noted that the present disclosure also includes other forms in which various modifications apparent to those skilled in the art are applied to the above-described embodiment and modification examples or forms in which structural components and functions in the above-described embodiment and modification examples are arbitrarily combined within the scope of the present disclosure.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:
1. A light emitting diode (LED) module comprising:
a substrate;
a resist including a plurality of layers, above the substrate; and
an LED element mounted above the resist via an adhesive, wherein
the adhesive includes an addition reaction type silicone resin, and
in the resist, a higher positioned layer of the plurality of layers is lower in at least one of sulfur content, phosphorus content, and nitrogen content than a lower positioned layer of the plurality of layers.
2. The LED module according to claim 1, wherein the adhesive includes a platinum-based catalyst.
3. The LED module according to claim 1, wherein an uppermost layer of the resist includes a thermosetting resist material.
4. The LED module according to claim 3, wherein the resist material is an epoxy resin.
5. The LED module according to claim 1, wherein an undermost layer of the resist includes a development-type resist material.
6. The LED module according to claim 1, wherein the resist is consists of two layers, the two layers being a first layer that is an undermost layer and a second layer that is an uppermost layer.

7. The LED module according to claim 6, wherein the second layer has a thickness greater than a thickness of the first layer.

8. The LED module according to claim 1, wherein the substrate includes a resin base.

9. The LED module according to claim 8, wherein the substrate includes a metal layer disposed on a surface of the resin base, and
the resist is disposed on a surface of the metal layer.

10. The LED module according to claim 9, wherein the LED element is an LED chip, and
the LED chip is connected to the metal layer through wire bonding.

11. The LED module according to claim 10, further comprising
a sealing member which seals the LED element.

* * * * *